(12) United States Patent
Hou et al.

(10) Patent No.: US 7,925,938 B2
(45) Date of Patent: Apr. 12, 2011

(54) STRUCTURE AND METHOD OF REPAIRING SDRAM BY GENERATING SLICING TABLE OF FAULT DISTRIBUTION

(75) Inventors: Chien-Tzu Hou, Fremont, CA (US); Hsiu-Ying Hsu, Taipei (TW)

(73) Assignee: Geneticware Co. Ltd., Tortola (VG)

( * ) Notice: Subject to any disclaimer, the term of this patent is extended or adjusted under 35 U.S.C. 154(b) by 1400 days.

(21) Appl. No.: 09/977,585

(22) Filed: Oct. 12, 2001

(65) Prior Publication Data

US 2003/0074612 A1   Apr. 17, 2003

(51) Int. Cl.
*G11C 29/00*   (2006.01)
(52) U.S. Cl. ........................................ 714/723
(58) Field of Classification Search .................. 714/723
See application file for complete search history.

(56) References Cited

U.S. PATENT DOCUMENTS

| | | | | |
|---|---|---|---|---|
| 5,758,056 A | * | 5/1998 | Barr ................................. | 714/7 |
| 5,970,000 A | * | 10/1999 | Kirihata et al. ................. | 365/200 |
| 6,052,798 A | * | 4/2000 | Jeddeloh ........................... | 714/8 |
| 6,181,614 B1 | * | 1/2001 | Aipperspach et al. ......... | 365/200 |
| 6,484,277 B1 | * | 11/2002 | Schonemann ................. | 714/710 |
| 6,493,654 B1 | * | 12/2002 | Sugimoto ...................... | 702/185 |
| 6,651,202 B1 | * | 11/2003 | Phan ............................ | 714/733 |

OTHER PUBLICATIONS

"Built-In Self-Repair for Divided Word Line Memory", Shyue-Kung Lu et al., Circuits and Systems, 2001, vol. 4, pp. 13-16, May 6-9, 2001.*
"A BISR (Built-In Self-Repair) Circuit for Embedded Memory with Multiple Redundancies", Heon-Cheol Kim et al., IEEE 1999 0-7803-5727-2/99, pp. 602-605, Oct. 26-27, 1999.*

* cited by examiner

*Primary Examiner* — Guy J. Lamarre
*Assistant Examiner* — John P Trimmings
(74) *Attorney, Agent, or Firm* — Karl F. Milde, Jr.

(57) ABSTRACT

A structure and method for repairing SDRAM by generating a Slicing Table of Fault Distribution and using the size of SDRAM page as the partition basic block. The Slicing Table of Fault Distribution is generated at each booting or memory-testing, and the elemental range of the number of detected defects is formed. When the number of detected defects exceeds the elemental range, the limits of another partition block with a lower rate of defects are used to cure the defect. The repair bit is also encoded according to the Slicing Table of Fault Distribution, pointing to the remapping bit so that the access operation occurs at the remapping bit. As such, the cost of producing, testing and repairing SDRAM is greatly reduced.

10 Claims, 8 Drawing Sheets

| a 2G DRAM has 521k memory pages( the size of every memory page is 4k bit) | | | |
|---|---|---|---|
| every 8k memory pages | every 16k memory pages | every 32k memory pages | every 128k memory pages |
| Two fault pages are tolerant in every 8k memory pages | Two fault pages in surplus are tolerant in every 16k memory pages | Two fault pages in surplus are tolerant in every 32k memory pages | Four fault pages in surplus are tolerant in every 128k memory pages |
| Need two associate memories and comparators | Need two associate memories and comparators | Need two associate memories and comparators | Need four associate memories and comparators |
| There are totally sixty four 8k memory pages in 512k (512/8=64) | There are totally thirty two 16k memory pages in 512k (512/16=32) | There are totally sixteen 32k memory pages in 512k (512/32=16) | There are totally four 128k memory pages in 512k (512/128=4) |
| 128 fault pages are totally tolerant (2*64=128) | 64 fault pages are totally tolerant (2*32=64) | 32 fault pages are totally tolerant (2*16=32) | 16 fault pages are totally tolerant (4*4=16) |

| PRODUCT | MPU | DRAM |
|---|---|---|
| $Y_{overall}$ | 75% | 85% |
| $Y_{random}$ | 83% | 89.5% |
| $Y_{systematic}$ | 90% | 95% |

Fig. 1
(PRIOR ART)

| a 2G DRAM has 521k memory pages (the size of every memory page is 4k bit) | | | | |
|---|---|---|---|---|
| every 8k memory pages | every 16k memory pages | every 32k memory pages | every 128k memory pages | |
| Two fault pages are tolerant in every 8k memory pages | Two fault pages in surplus in every 16k memory pages | Two fault pages in surplus are tolerant in every 32k memory pages | Four fault pages in surplus are tolerant in every 128k memory pages | |
| Need two associate memories and comparators | Need two associate memories and comparators | Need two associate memories and comparators | Need four associate memories and comparators | |
| There are totally sixty four 8k memory pages in 512k memory pages (512/8=64) | There are totally thirty two 16k memory pages in 512k memory pages (512/16=32) | There are totally sixteen 32k memory pages in 512k memory pages (512/32=16) | There are totally four 128k memory pages in 512k memory pages (512/128=4) |
| 128 fault pages are totally tolerant (2*64=128) | 64 fault pages are totally tolerant (2*32=64) | 32 fault pages are totally tolerant (2*16=32) | 16 fault pages are totally tolerant (4*4=16) |

Fig. 5

STRUCTURE AND METHOD OF REPAIRING SDRAM BY GENERATING SLICING TABLE OF FAULT DISTRIBUTION

FIELD OF INVENTION

This invention is generally related to the structure and method for mending or repairing SDRAM. More specifically, it relates to the generation of Slicing Table of Fault Distribution, and encoding the repair bit according the Slicing Table of Fault Distribution. By pointing to the remapping bit, the access action occurs at the remapping bit so as to maintain the quality of the SDRAM product.

BACKGROUND OF INVENTION

Any for profit SDRAM producer would know that quality of the SDRAM product is a key factor in determining the profit. Therefore, a majority of the IC producers have invested money in reducing the number of defective product, including incentives for workers, technicians and engineers to find ways to enhance the quality of the IC product. After analyzing the production volume of the IC producers for the past 25 years, a 1991 publication in the form of VISL dissertation stated that an IC producer generally invests at least 600 to 700 million dollars to increase the qualification rate to at least 85 percent. Moreover according to a 1991 publication by the Semiconductor Industry Union entitled the "International Technology Roadmap for Semiconductors in Defect Reduction", it is stated that the qualification rate is limited to between 85 to 95 percent for the IC producer regardless of the debasing deficiency generated by the product-processing or the equipments, as shown in FIG. 1.

To reduce the waste cost of the 5 to 15 percent defective product, SDRAM producers generally undertake a repair program to mend or repair the 5 to 15 percent defective product, so as to raise the qualification rate. A few of the common repair methods adopted by the SDRAM producer are discussed hereinbelow:

(1) Logical Method

As shown in FIG. 2, the various features of this method include the testing step and patch step. The testing-step is to test whether the memory 100 has defective cells 110, and if it has, record the address of the defective cells 110. The patch step is to use comparator 120 to compare the recorded defective address 130 in the testing-step with the address of access date transferred by the CPU, and if the address of access date is in the record, it will re-map the address to the patch-memory 140 (usually SRAM). By using one of the cells in patch-memory to replace the defective cell in the testing-memory, it would cure the defective product. However, the shortcomings of this repair method are:

1. The address signal, which is transferred by the CPU, is not only presented to the testing-memory 110, but also to the patch-memory 140. So this address signal must have enough fan-out power or it can be mistakenly distinguished.

2. Since the repair process is slow the comparator 120 must compare the address one by one, and it can take a long time to patch the memory page.

3. There must be a colossal scale and high ability comparator 120, which is very expensive.

(2) Spare Fault-Tolerant Method

As shown in FIG. 3, the main feature is the repair process of the wafer test. Memory 200 will make spare array elements 220 while making the wafer. During the test, CPU sends the row address 230 to the cell of memory 200 first, then send the column address to test every memory cell after a proper TRCD. Once finding the defective cells 210, it replaces the defective cells 210 with spare array elements 220 in a radiate mode to make the defective product effective. The shortcomings of this repair method are:

1. The repair only occurs during the wafer test. If the wafer is cut or sealed, the method would fail.

2. It takes 1.5 seconds to repair every die, which is too long.

3. It increases the cost of repair in the radiate mode.

The above-described conventional repair methods, especially the latter one, greatly increase the investment cost for the SDRAM producer.

SUMMARY OF INVENTION

The invention is directed to a structure and method for repairing a memory defect in SDRAM to reduce cost and increase profit for the SDRAM producer.

In order to achieve the above object, the invention generates a Slicing Table of Fault Distribution during booting or memory-testing. The particular steps are as follows: dividing the SDRAM into memory pages of a proper size; using 4 k as the criteria according to the statistical data of the memory fault distribution, and a range of $4 k*2^n$ as the partition unit; for the possible defects in every 8 k, 16 k, 32 k, and 128 k memory, posting the number of the tolerate-mistake memory pages, arranging and preserving the number of the memory and the quantity of the comparator correspond to the address of the incorrect memory pages.

The present invention also uses the Slicing Table of Fault Distribution to repair SDRAM. The particular steps are as follows:

a. booting the system;

b. executing memory-test to find the address and distribution of the fault in the memory chip;

c. if the fault distribution is in the planned range in advance, establishing a slicing table of fault distribution;

d. if the fault distribution is concentrated in a certain range, establishing a slicing table of fault distribution and posting to the address limiter;

e. inputting the address into the address limiter;

f. using the comparator arrays to check whether the input address is in a different address range according to the slicing table of fault distribution;

g. if there are no faults, mapping the input address to the SDRAM and reading data from that address;

h. if there are some faults, generating a fault enable signal so that the system will not read any data at the original input address and generate a signal of fault transferred to the encoder;

I. using the encoder to set up a repair address for the fault;

j. using the repair memory to point to a new remapping address according to the repair address;

k. replacing the original input address with the remapping address sc that data will be read out at the remapping address in the SDRAM.

Additionally, a structure is presented according to the above-described methods, and includes at least the followings: a plurality of Address Limiters, a plurality of correspond memories, a plurality of comparator arrays, an encoder, a repair memory and a multiplexer.

BRIEF DESCRIPTION OF DRAWINGS

FIG. 1 illustrates the qualification rate statistics of the memory of the IC manufacture factories recently;

FIG. 5 illustrates the Slicing Table of Fault Distribution in the embodiment;

DETAILED DESCRIPTION OF INVENTION

A preferred embodiment accompanied with the drawings is explained herein below in detail.

Figure 2:
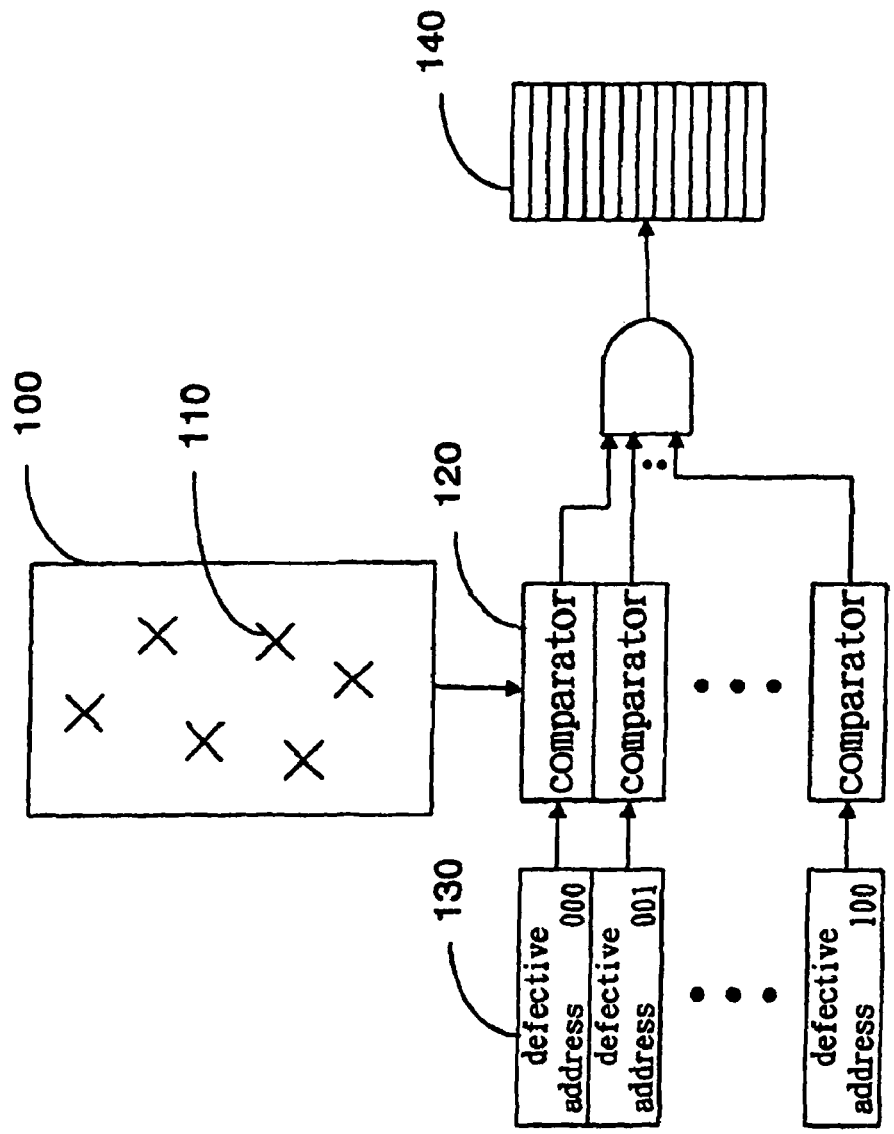
FIG. 2 illustrates the logical repair method for the memory.
Figure 3:
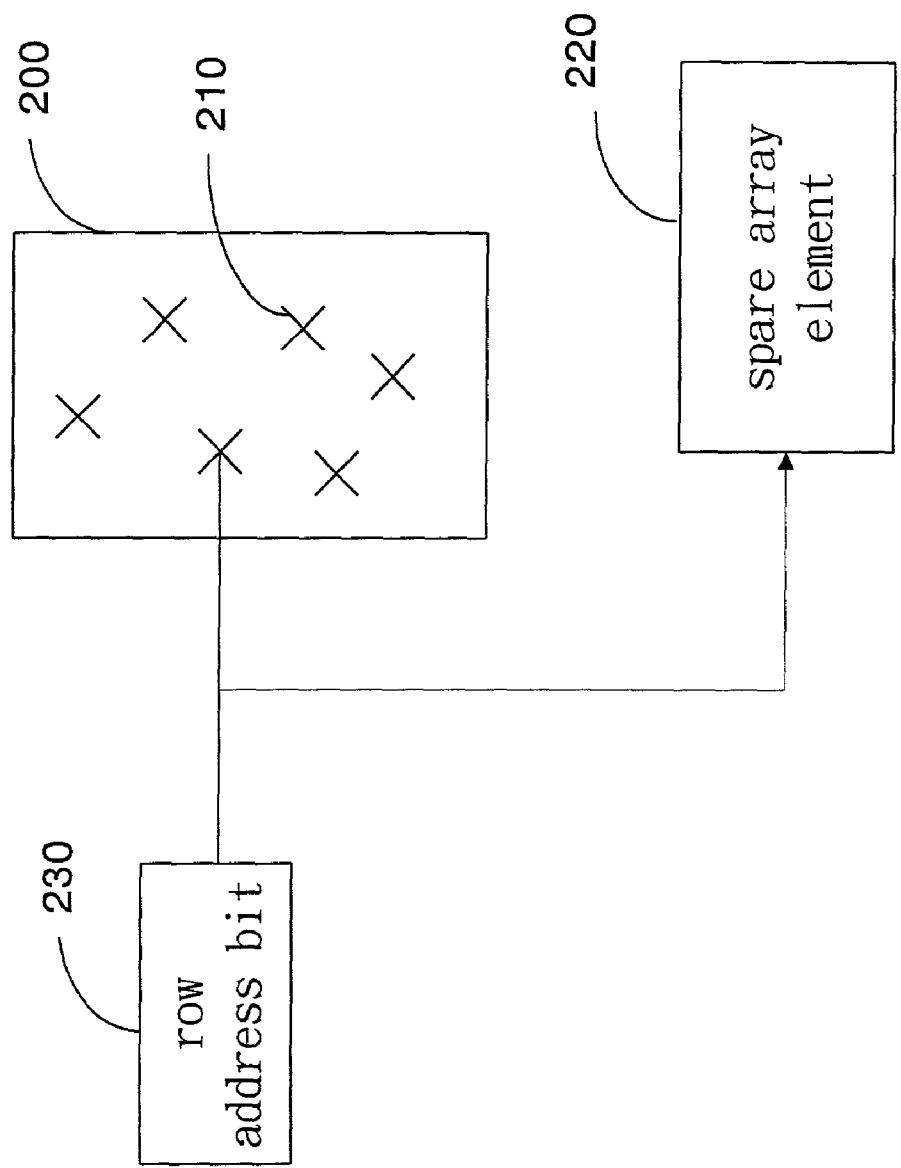
FIG. 3 illustrates the spare fault-tolerant method for the memory.
Figure 4:
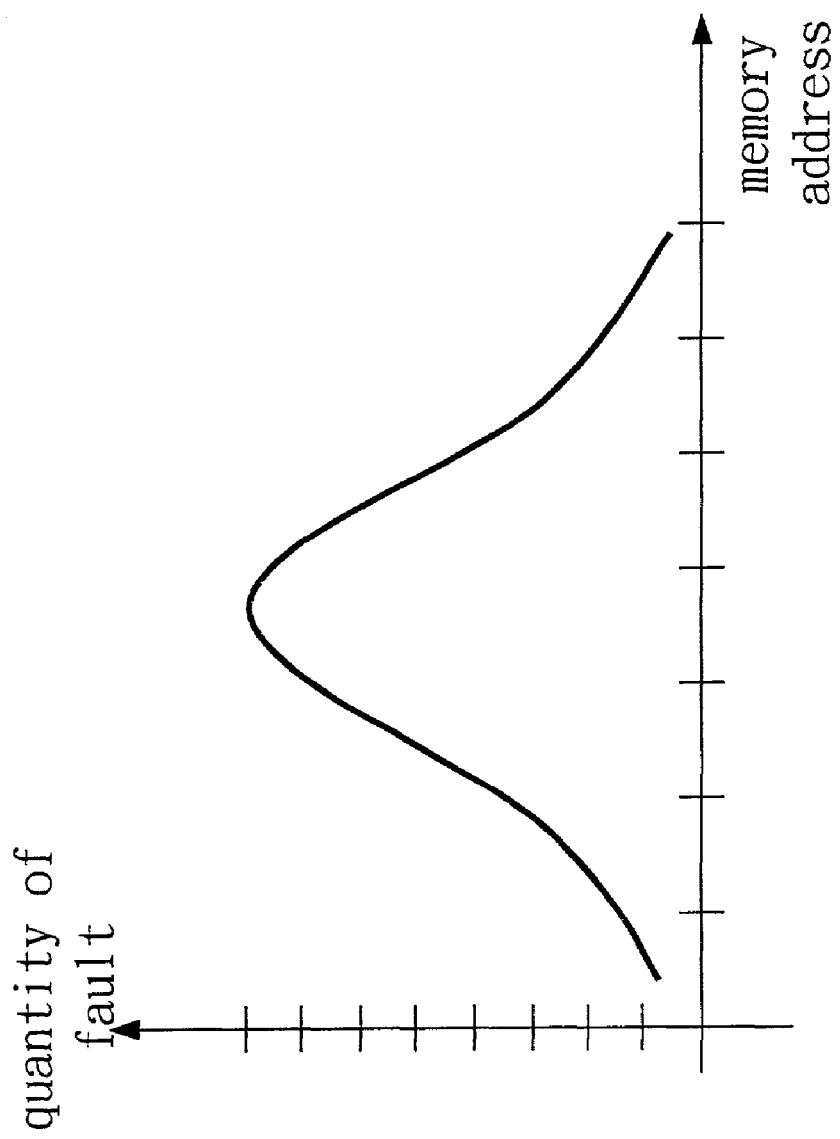
FIG. 4 illustrates the normal fault distribution of the memory according to the statistical data.

From the statistical data as shown in FIG. 4, the quantity of fault at, for instance, 8 k, 16 k, 32 k, or 128 k memory is used to establish the Slice Table of Fault Distribution. By accurately determining the number of the defective memory pages, all the resources are efficiently used. In this invention, the empirical value is preserved in the memory chip, so that when the system is booted and the SDRAM pages are checked, the Slicing Table of Fault Distribution is established.

If there is a 2 G SDRAM, then every memory page has 4 k bytes for a total of 521 k memory pages. Since the statistical data of all defective memory pages in the 2 G SDRAM and the number of the defective memory pages according to every 8 k, 16 k, 32 k, 128 k under normal conditions are known, the Slicing Table of Fault Distribution would be established according to these data, and setting the associate memory and corresponding comparator, and preserving the remapping address of the defective memory pages.

Although executing more comparators at the same time would accelerate the process of locating and repairing defective pages, it will also cost more in the surplus relevant memory (i.e., SDRAM) and comparator. Therefore, using more than 16 relevant memories and comparators has not been considered due to cost considerations.

FIG. 5 illustrates an example of contents of the Slicing Table of Fault Distribution. In particular, for the statistical data of memory fault distribution, 4 k is used as the criteria, and every 4 k*2n range is used as the partition unit (n is the integer more than or equals 0) to divide the memory pages. In this example, every 8 k, 16 k, 32 k, and 128 k are used as the partition unit, and different ranges can be utilized based on different conditions. In all these ranges, the number of the tolerant fault memory pages, and the number of the associate memories for preserving the address of the fault memory pages are set up as follows:

1. Two fault memory pages (memory cells) are permitted in every 8 k memory pages, and two associate memories are arranged to preserve the address of fault memory pages found in the range of 8 k memory pages, and two comparators to compare the address stored in the associate memories with the input address offset.

2. Two fault memory pages (memory cells) are permitted in every 16 k memory pages, and two associate memories are arranged to preserve the address of fault memory pages found in the range of 16 k memory pages, two comparators to compare the address stored in the associate memories with the input address offset.

3. Two fault memory pages (memory cells) are permitted in every 32 k memory pages, and two associate memories are arranged to preserve the address of fault memory pages found in the range of 32 k memory pages, two comparators to compare the address stored in the associate memories with the input address offset.

4. Four fault memory pages (memory cells) are permitted in every 128 k memory pages, and four associate memories are arranged to preserve the address of fault memory pages found in the range of 128 k memory pages, four comparators to compare the address stored in the associate memories with the input address offset.

Since every memory page is 4 k, there are a total of 512 k memory pages for a 2 G SDRAM.

If the partition unit is a 8 k memory page (i.e., two 4 k memory page), it will be divided into sixty-four 8 k memory pages. At the same time, 2 fault memory pages are tolerant in every 8 k memory pages, so that overall 128 fault memory pages are tolerant in this partition rage.

If the partition unit is a 16 k memory page (i.e., four 4 k memory page), it will be divided into thirty two 16 k memory pages. At the same time, 2 fault memory pages are tolerant in every 16 k memory pages, so that overall 64 fault memory pages are tolerant in this partition rage.

If the partition unit is a 32 k memory page (i.e., eight 4 k memory page), it will be divided into sixteen 32 k memory pages. At the same time, 2 fault memory pages are tolerant in every 32 k memory pages, so that overall 32 fault memory pages are tolerant in this partition rage.

If the partition unit is a 128 k memory page (i.e., thirty-two 4 k memory page), it will be divided into four 128 k memory pages. At the same time 4 fault memory pages are tolerant in every 128 k memory pages, so that overall 16 fault memory pages are tolerant in this partition rage.

Based on the above-description, 240 fault memory pages (128+64+32+16=240) are permitted in a 2 G SDRAM.

Figure 6:
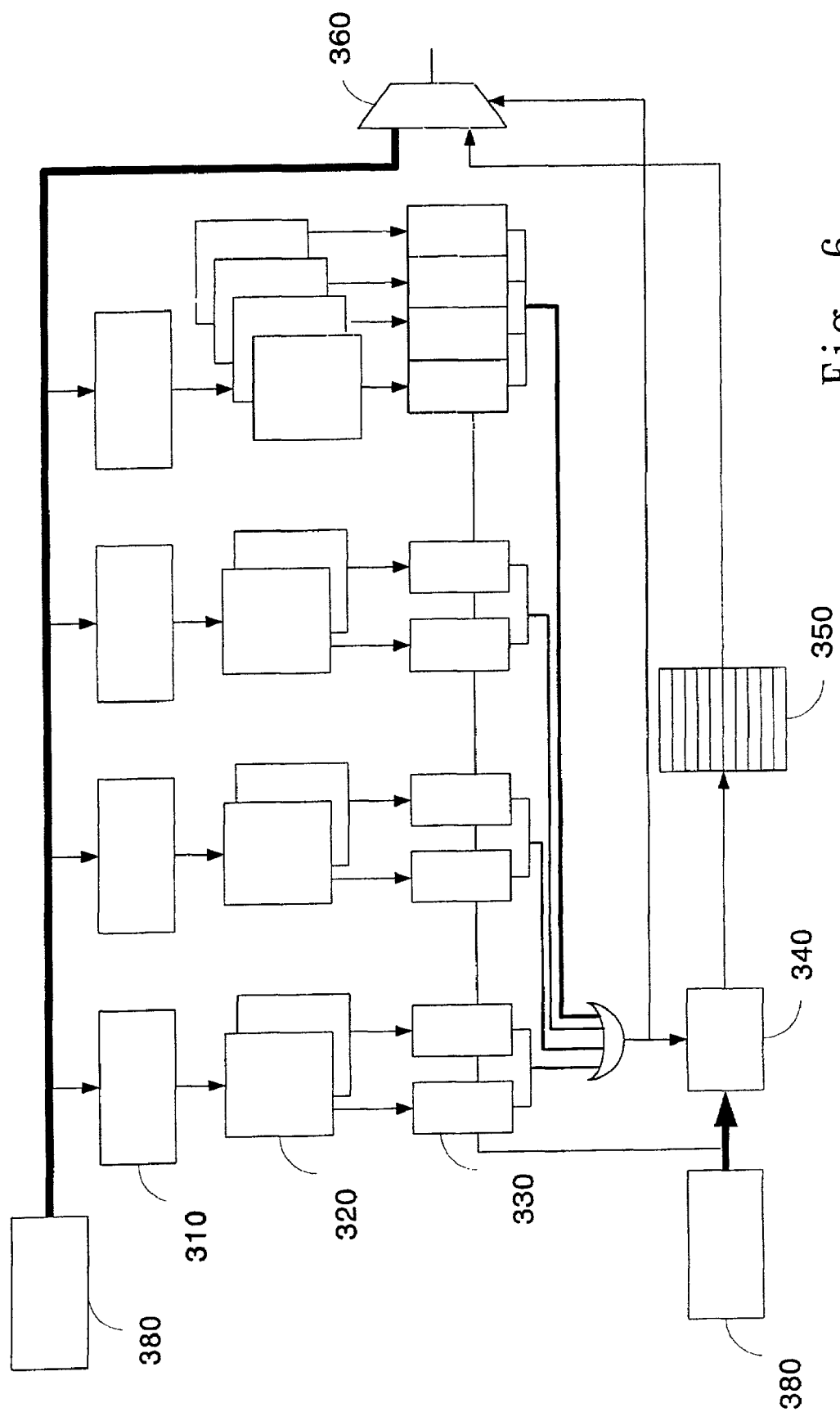
FIG. 6 illustrates the outline map of the structure in the embodiment.

In the following, an example is used to explain the actual work (from the input address to the output address) in the memory chip. As shown in FIG. 6, the structure of the memory chip includes: address limiters 310, associate memories 320, comparator arrays 330, encoder 340, repair memory 350 and multiplexer 360.

Figure 7:
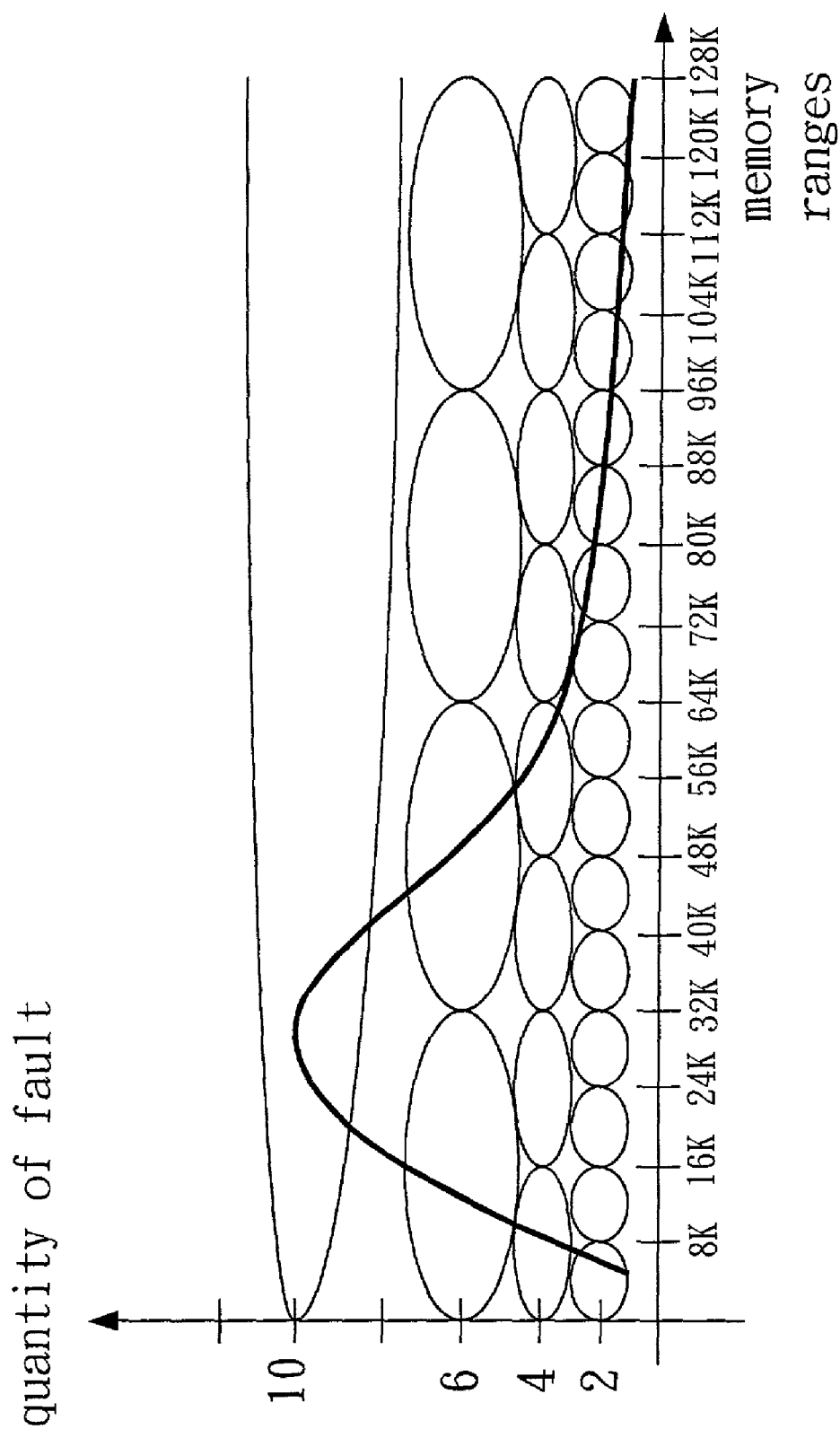
FIG. 7 illustrates that the graphical chart of fault distribution in the FIG. 4 drifts from central to left.

Referring to the address limiter 310, to the Slicing Table of Fault Distribution, when the number of faults exceeds the limit of one specific partition, the address of the block is restricted, and this fault is cured by using the limit of fault of other partition with a lower fault rate. FIG. 4 illustrates that the normal fault distribution area of the memory is based on the statistical data. However when the SDRAM has a higher serious fault rate at the lower address range, the graphical chart of fault distribution drifts leftward from a central position as shown in FIG. 7. The number of the actual fault pages (cells) at the lower address range will exceed the number of the tolerant fault pages in the partition area.

In the example as shown in FIG. 7, there are about less than ten fault pages in the range of 32 k memory pages. But according to the criteria of the tolerant fault pages in a partition, i.e., 2 fault pages in 8 k, 4 fault pages in 16 k, 6 fault pages in 32 k and maximum 10 fault pages in 128 k, one must use other 128 k partition to overlay these surplus fault pages. Although the distribution of the tolerant faults can be arranged, the total of the tolerant fault is not to be changed. In the other word, if a partition has more fault than the limit so as to not change the total tolerant fault, then the fault limit of other partition has to be sacrificed to make up for this special partition, and this method is called address limit of the memory. When the computer system opens up, the system finds the memory address partition having the maximum fault after testing the memory, and the fault limit of several other partitions is sacrificed to make up this special partition so that the fault overlays every flexible partition.

Referring to the associate memory 320, it is used to preserve the address of the fault memory pages. The quantity is associated with the tolerant fault for the partition. As shown in FIG. 5, in a 20 bit (~$2^{31}$ bit) SDRAM (address: A30:A0), every memory page is 4 k (~$2^{12}$ bit) (address: A11:A0), so that there are 512 k (~$2^{19}$ bit) memory pages totally (address: A30:A12). According to the example Slicing Table of Fault Distribution as shown in FIG. 5, two fault memory pages are tolerant in every 8 k memory pages and two associate memories are arranged to preserve the address of fault memory pages. As the two and fgur associate memories are increased in surplus to preserve the address of fault memory pages in every 16 k, 32 k and 128 k memory pages. A bit is appended to validate whether there is any fault (0 is for no fault, 1 is for having fault), so that the size of every associate memory is (2 G/32M)*(the address offset+1) bit for the range of 8 k (~$2^{25}$ bit) memory. This address offset is A30:A25.

Comparator array 330 compares the input address 380, the address selected by the address limiters 310, and the output address of the associate memory 320, then judges whether they are of different ranges of the memory address and determines whether there is any fault. When the input address 380 wanted by the SDRAM is transferred into the memory chip, the address will be selected by the memory address limits 310. In order to be selected, the input address 380 and the output address of the associate memory 320 are checked by the associate memory 330 at the same time so as to determine whether they are of different memory address ranges. Delay occurs by association, but the memory works at the same association, so that there is no efficacy loss. If no defective page is found, data are to be read in the normal state at the address; if there are defective pages, a signal of fault is transferred to the encoder 340.

Referring to the encoder 340, after receiving the signal of fault, the encoder 340 will generate a remapping address correspond to the repair memory 350. The repair memory 350 includes the information of the remapping address. The repair address is generated by a special encoding method, and includes two type of data, one of which is the tolerant faults in the memory page range, and the other one is the partition of the input address.

Referring to the repair memory 350, the memory page address (obtained through the encoder 340) needs to be repaired is pointed to a new remapping address in the repair memory 350, and the data are preserved. The size of repair memory 350 is determined by the length of repair address and the tolerant limit of fault pages in the slicing distribution range.

As to the multiplexer 360, it is controlled by the fault enable signal generated by the comparator array 330. As a result, it helps the system to select the original address or the remapping the address to read data.

Figure 8:
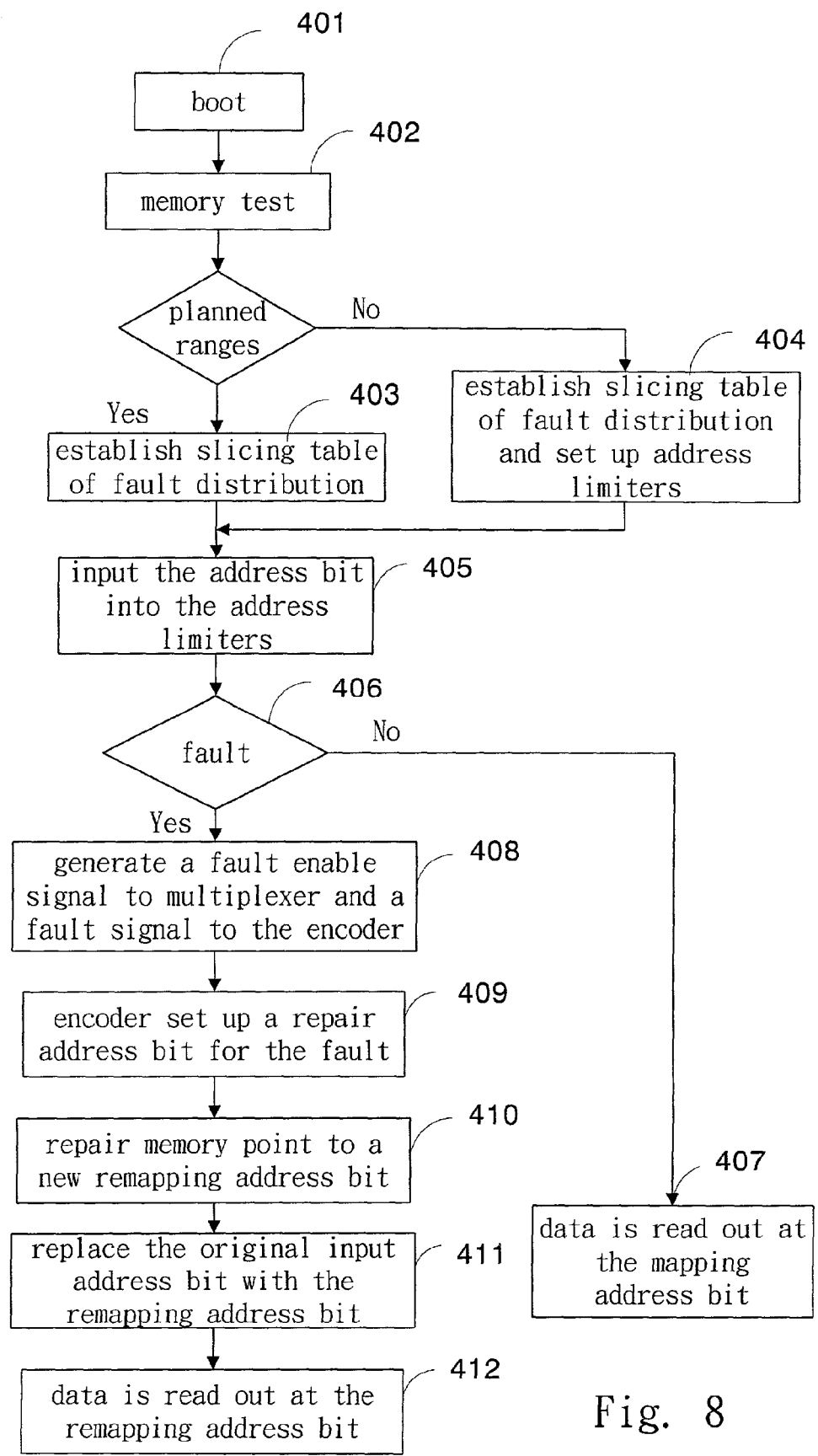
FIG. 8 is a flow chart of this invention.

As shown in FIG. 8, the present invention includes the following steps: (1) executing memory testing to find the address and distribution of the fault in the memory chip (step 402) after the system boots (step 401); (2) if the fault distribution is in the planned range in advance, then a slicing table of fault distribution is established (step 403); (3) when the fault distribution is concentrated in a certain range, a slicing table of fault distribution is established and the address limiters 310 is posited (step 404), and the memory controller inputs the address into the address limiters 310 (step 405), and then the comparator array 330 checks to find whether the input address 380 is of different address ranges according to the slicing table of fault distribution (step 406); (4) if there are no faults, then the input address will be mapped to the SDRAM and data are read at the mapping address (step 407); (5) if there are some faults, a fault enable signal is generated and transferred to multiplexer 360, isolating the SDRAM and the original input address, so that the system does not read any data at the original input address and generates a signal of fault transferred to the encoder 340 (step 408), then the encoder 340 sets up a repair address for the fault (step 409), and the repair memory 350 points to a new remapping address according to the repair address (step 410), at the same time replaces the original input address with the remapping address (step 411), data are read out at the remapping address in the SDRAM (step 412).

The above disclosure is not intended as limiting. Those skilled in the art will recognize that numerous modifications and alterations may be made while retaining the teachings of the invention. Accordingly, the above disclosure should be construed as limited only by the restrictions of the appended claims.

What is claimed is:

1. A method of generating a slicing table of fault distribution comprising:
   a. dividing a memory into a number of memory pages of a predetermined size;
   b. calculating a fault quantity for each 4 k*2" range according to statistical data of a memory fault distribution, n being an integer greater than or equal to zero, so that ranges include 4K, 8K, 16K, 32K, 64K, and 128K;
   c. making a number of divisions using a range of the memory pages as a partition unit; and
   d. posting a number of fault memory pages and arranging a number of associate memories to preserve an address of the fault memory pages and state of the comparators.

2. The method of claim 1, wherein in step c, when n is 1, the partition unit constitutes 8 k memory pages, two of the fault memory pages are set to be tolerant, and two of the associate memories and comparators are arranged in step d.

3. The method of claim 1, wherein in step c, when n is 2, the partition unit constitutes 16 k memory pages, two of the fault memory pages are set to be tolerant, and two of the associate memories and comparators are arranged in step d.

4. The method of claim 1, wherein in step c, when n is 3, the partition unit constitutes 32 k memory pages, two of the fault memory pages are set to be tolerant, and two of the associate memories and comparators are arranged in step d.

5. The method of claim 1, wherein in step c, when n is 5, the partition unit constitutes 128 k memory pages, four of the fault memory pages are set to be tolerant, and four of the associate memories and comparators are arranged in step d.

6. The method of claim 1, wherein the slicing table of fault distribution is built in a memory chip.

7. A structure of repairing a SDRAM by generating a slicing table of fault distribution comprising:
   a plurality of address limiters to restrict an address of a block when faults exceed a partition limit according to the slicing table of fault distribution and to repair the faults by using a fault limit of another partition with a lower fault rate;
   a plurality of associate memories to preserve the address of a fault memory page, and a number corresponding to a tolerant fault of a partition area;
   a plurality of comparator arrays to compare an input address with an output address of an address limit to determine different ranges of memory address, decide whether any default exists, and generate a fault signal transferred to an encoder;

an encoder to set up a repair address associated with a repair memory after receiving said fault signal; and a repair memory to point a memory page address generated by said encoder to a new remapping address so as to preserve the data.

8. The structure of claim 7, further comprising a multiplexer being provided to be controlled by a fault enable signal generated by said comparator arrays, so that the system reads data from the original address or the remapping address.

9. The structure of claim 7, wherein the repair address comprises an address column.

10. A method of repairing a SDRAM by generating a slicing table of fault distribution comprising:

a. booting a system;

b. executing a memory test to find an address and distribution of a fault in the memory chip;

c. if the fault distribution is in the planned range, establishing the slicing table of fault distribution;

d. if the fault distribution is concentrated in a predetermined range, establishing the slicing table of fault distribution and posting address limits;

e. inputting an address into the address limits;

f. using comparator arrays to check whether an input address is in different address ranges according to the slicing table of fault distribution;

g. if there are no faults, mapping the input address to the SDRAM and reading data at the mapping address;

h. if there are faults, a fault enable signal is generated, so that data at the original input address are not read and a fault signal is transferred to an encoder;

I. using said encoder to set up a repair address for the fault;

j. pointing a repair memory to a new remapping address according to the repair address;

k. replacing the original input address with a remapping address; and

I. reading data at the remapping address in the SDRAM.

\* \* \* \* \*